(12) United States Patent
Suh

(10) Patent No.: US 6,661,055 B2
(45) Date of Patent: Dec. 9, 2003

(54) TRANSISTOR IN SEMICONDUCTOR DEVICES

(75) Inventor: Jai Bum Suh, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/026,955

(22) Filed: Dec. 27, 2001

(65) Prior Publication Data

US 2003/0094651 A1 May 22, 2003

(30) Foreign Application Priority Data

Nov. 17, 2001 (KR) ........................................ 2001-71584

(51) Int. Cl.$^7$ .............................................. H01L 29/76
(52) U.S. Cl. ...................... 257/331; 257/326; 257/900; 257/369; 257/288; 257/296; 257/297; 257/327; 257/330; 257/332; 257/334; 438/267; 438/366; 438/367; 438/446; 438/595; 438/629; 438/739
(58) Field of Search .................. 257/331, 326, 257/900, 369, 288, 296, 297, 327, 330, 332, 334; 438/267, 366, 367, 446, 595, 629, 739

(56) References Cited

U.S. PATENT DOCUMENTS 6,090,693 A * 7/2000 Gonzalez et al. ........... 438/592
6,399,451 B1 * 6/2002 Lim et al. ................... 438/303

* cited by examiner

Primary Examiner—Tom Thomas
Assistant Examiner—Junghwa Im
(74) Attorney, Agent, or Firm—Morgan, Lewis & Bockius LLP

(57) ABSTRACT

The present invention relates to a transistor in a semiconductor device and method of manufacturing the same. According to the present invention, the transistor has an auxiliary electrode to which a voltage is applied apart from a gate electrode and formed at both sides of the gate electrode. In a transistor that is turned on/off depending on a voltage applied to the gate electrode, a region where the gate electrode and the source/drain overlap is maintained to have the same voltage by the auxiliary electrode by always applying a high voltage to the auxiliary electrode upon an on operation of the transistor even when the gate electrode becomes a zero (0) volt upon a refresh operation of a DRAM device. Therefore, the present invention can prevent generation of GIDL current. Further, even though the gate electrode is continuously turned on/off, the auxiliary electrode always maintains the same voltage between the gate electrode and the bit line. Therefore, the present invention can generation of a coupling noise due a shielding effect.

3 Claims, 5 Drawing Sheets

TRANSISTOR IN SEMICONDUCTOR DEVICES

BACKGROUND OF THE INVENTION

1. Field of the Invention

The invention relates generally to a transistor in a semiconductor device and method of manufacturing the same, and more particularly to, a transistor in a semiconductor device and method of manufacturing the same, capable of improving a refresh operating characteristic of a DRAM device and preventing generation of a coupling noise.

2. Description of the Prior Art

Generally, as the integration level of a semiconductor device becomes higher, the width of a gate electrode and a channel in a transistor becomes narrow and the depth of a source and a drain becomes shallows. Even though, there is a need for a transistor of a high performance. Further, as the semiconductor device becomes highly integrated, it is difficult to individually define respective contact patterns since the size of a contact and the distance between the contacts are very small in patterning a bit line contact and a storage node contact in a cell. In order to solve this problem, a method is usually employed by which the bit line contact and the storage node contact are separated from the hard mask layer formed on the gate electrode by a chemical mechanical polishing method using an etch barrier, after a large contact pattern is formed by a self-aligned contact etch process at a time.

FIGS. 1A~1C are cross-sectional views of a conventional semiconductor device for describing a method of manufacturing a transistor in the device;

Referring now to FIG. 1A, a device isolation film 12 is formed in a semiconductor substrate 11 to define an active region. Then, a gate oxide film 13, a gate electrode 14 and a hard mask layer 15 are sequentially stacked on the semiconductor substrate 11 in which the device isolation film 12 is formed. An oxide film 16 is formed at the sidewall of the gate electrode 14 and the exposed surface of the semiconductor substrate 11 by means of gate re-oxidation process.

In the above, the device isolation film 12 is formed using a shallow trench isolation (STI) process for higher-integration of the device. The hard mask layer 15 is formed of a nitride-series material.

Referring now to FIG. 1B, a source 17s and a drain 17d are formed in the semiconductor substrate 11 by a source/the drain ion implantation process. An insulating film spacer 18 is formed at the sidewall of a stack structure including the gate electrode 14 and the hard mask layer 15.

In the above, the insulating film spacer 18 is formed of a nitride-series material same to the hard mask layer 15.

Referring now to FIG. 1C, an inter-dielectric layer 19 is formed on the entire structure including the insulating film spacer 18. Contact holes through which the source 17s and the drain 17d are exposed, respectively, are formed by a self-aligned contact mask process and an etch process of the interlayer insulating layer 19. Next, a storage node contact 20 connected to the source 17s and a bit line contact 21 connected to the drain 17d are formed.

In the above, polysilicon is deposited and an etch-back process or a chemical mechanical polishing (CMP) process is performed to form the storage node contact 20 and the bit line contact 21.

General processes such as processes of forming bit lines, capacitors and metal wires are performed to complete a semiconductor device.

A space of each of the storage node contact and the bit line contact with the gate electrode is narrowed due to higher integration of the semiconductor device. Due to this, a problem such as an electrical short is caused. Also, as a zero (0) voltage is applied to the gate electrode in a refresh operation mode of a DRAM device and high date is stored at the storage node, there is a problem that a gate induced drain leakage (GIDL) current is generated by the difference in the voltage between the gate electrode and the storage node to degrade the refresh operating characteristic of the DRAM device. Further, as the gate electrode is continuously turned on/off, there is a problem that a normal operation of the DRAM is adversely affected by a coupling phenomenon due to a parasitic capacitance between the bit line and the gate electrode.

SUMMARY OF THE INVENTION

It is therefore an object of the present invention to provide a transistor in a semiconductor device and method of manufacturing the same, capable of improving a refresh operating characteristic of a DRAM device and preventing generation of a coupling noise.

In order to accomplish the above object, a transistor in a semiconductor device according to the present invention, is characterized in that it comprises a gate electrode electrically isolated from the semiconductor substrate by a gate oxide film and connected to a first power supply source; a source formed in the semiconductor substrate at one side of the gate electrode; a drain formed in the semiconductor substrate at the other side of the gate electrode and formed oppositely to the source; and an auxiliary electrode formed at both sides of the gate electrode, electrically isolated from the gate electrode, the source and the drain, respectively, by means of the oxide film and connected to a second power supply source.

In the above, upon an on operation of the transistor, the same voltage to a voltage applied to the gate electrode is applied to the auxiliary electrode.

Also, a method of manufacturing a transistor in a semiconductor device according to the present invention, is characterized in that it comprises the steps of forming a structure in which a gate oxide film, a gate electrode and a hard mask layer are stacked on a semiconductor substrate in which a device isolation film is formed; forming an oxide film at the sidewall of the gate electrode and an exposed surface of the semiconductor substrate; forming a source and a drain in the semiconductor substrate; forming an auxiliary electrode at the sidewall of the stack structure including the gate electrode and the hard mask layer; forming an insulating film spacer connected to the hard mask layer on the auxiliary electrode; forming a storage node contact connected to the source and a bit line contact connected to the drain; and connecting a first power supply source to the gate electrode and a second power supply source to the auxiliary electrode, in a subsequent process of forming a metal wire.

In the above, the auxiliary electrode is formed by depositing a conductive material such as polysilicon, tungsten, aluminum, tungsten silicide, tungsten nitride or the like and then performing a reactive ion etching process. Upon the reactive ion etching process, over-etch is performed to position an upper side of the auxiliary below an upper side of the stack structure.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
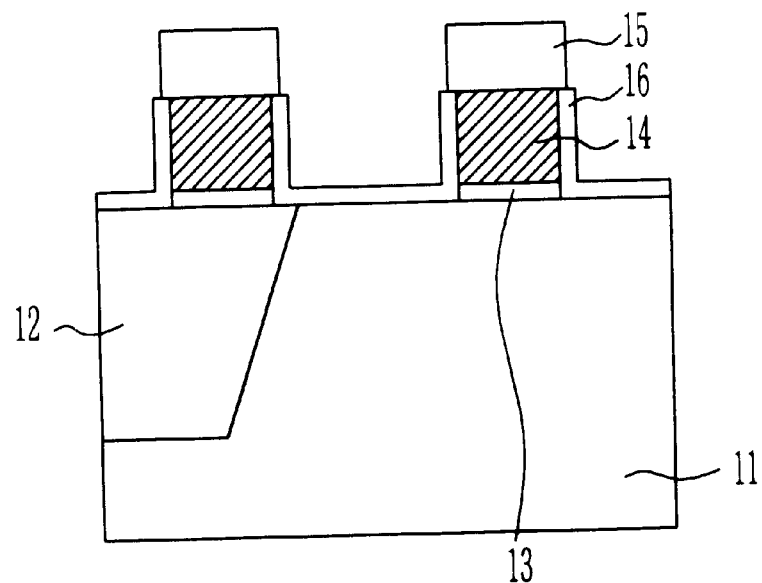
FIGS. 1A~1C are cross-sectional views of a conventional semiconductor device for describing a method of manufacturing a transistor in the device.
Figure 1B:
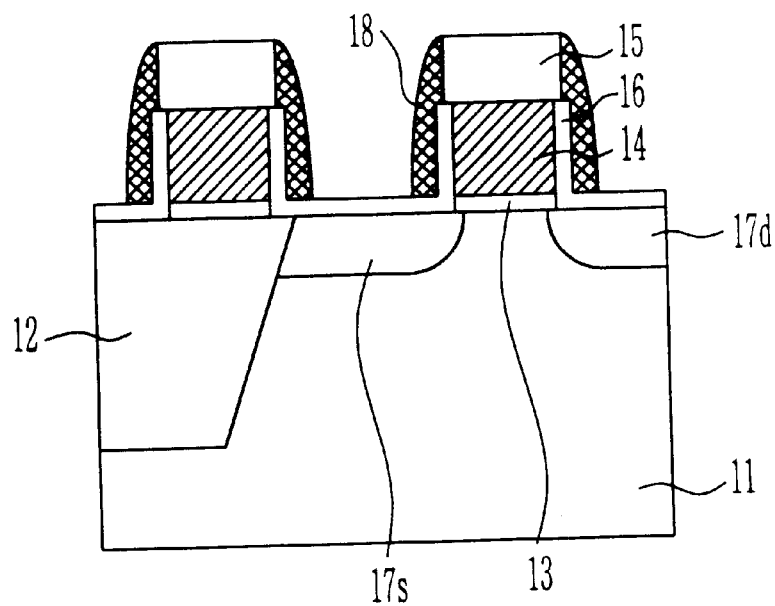
Figure 1C:
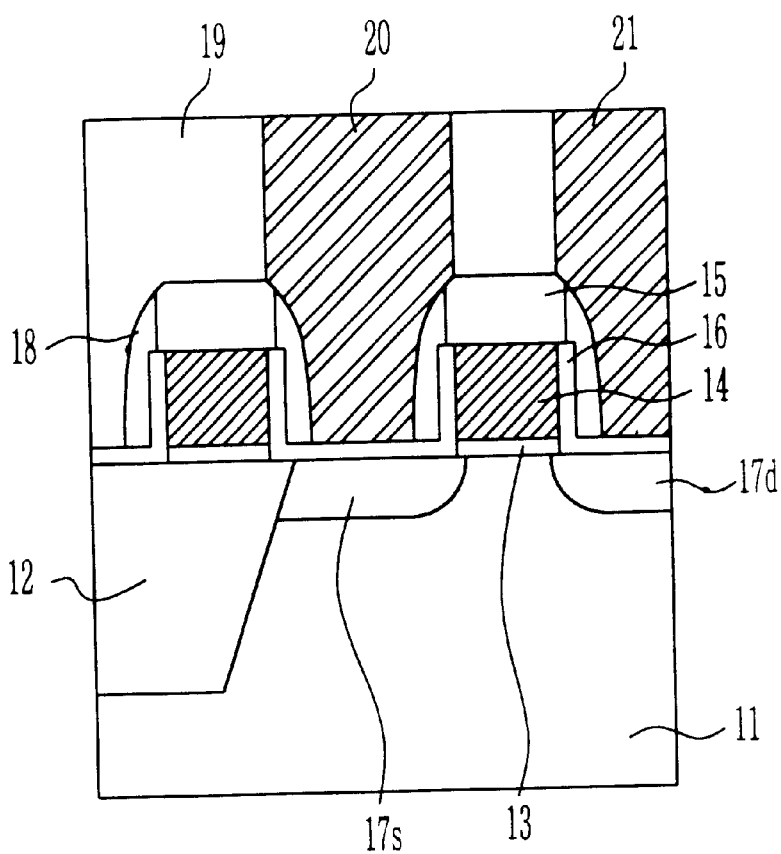

The present invention will be described in detail by way of a preferred embodiment with reference to accompanying drawings, in which like reference numerals are used to identify the same or similar parts.

FIGS. 2A~2D are cross-sectional views of a semiconductor device for describing a method of manufacturing a transistor in the device according to one embodiment of the present invention.

Figure 2A:
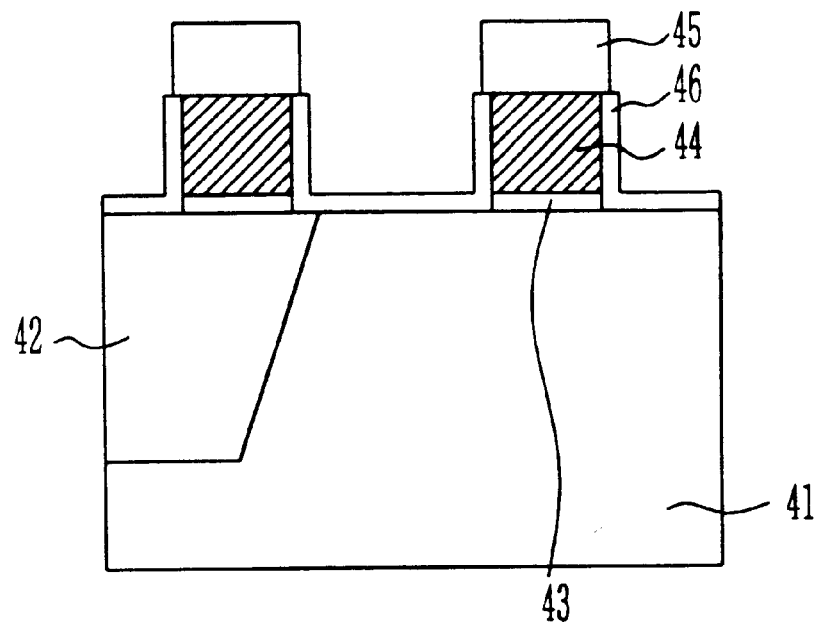
FIGS. 2A~2D are cross-sectional views of a semiconductor device for describing a method of manufacturing a transistor in the device according to one embodiment of the present invention.

Referring now to FIG. 2A, a device isolation film 42 is formed in a semiconductor substrate 14 to define an active region. Then, a gate oxide film 43, a gate electrode 44 and a hard mask layer 45 are sequentially stacked on the semiconductor substrate 41 in which the device isolation film 42 is formed. An oxide film 46 is formed at the sidewall of the gate electrode 44 and the exposed surface of the semiconductor substrate 41 by means of gate re-oxidation process.

In the above, it is preferred that the device isolation film 42 is formed using a shallow trench isolation (STI) process for higher-integration of the device. It is preferable that the hard mask layer 45 is formed of a nitride-series material.

Figure 2B:
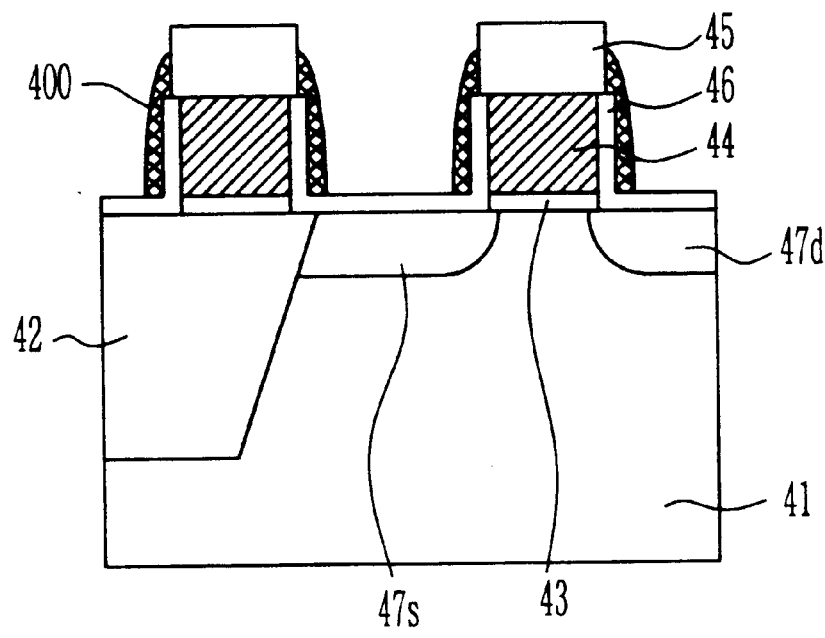

Referring now to FIG. 2B, a source 47s and a drain 47d are formed in the semiconductor substrate 41 by a source/the drain ion implantation process. An auxiliary electrode 400 is formed at the sidewall of a stack structure including the gate electrode 44 and the hard mask layer 45.

In the above, the auxiliary electrode 400 is formed by depositing conductive materials, for example, a material generally used as an electrode in the semiconductor device such as polysilicon, tungsten, aluminum, tungsten silicide, tungsten nitride and the like on the entire structure including the stack structure and then performing a reactive ion etching process. At this time, an upper side of the auxiliary electrode 400 is located below an upper side of the stack structure by an over-etch process. The auxiliary electrode 400 is electrically isolated from the gate electrode 44, the source 47s and the drain 47d by means of the oxide film 46.

Figure 2C:
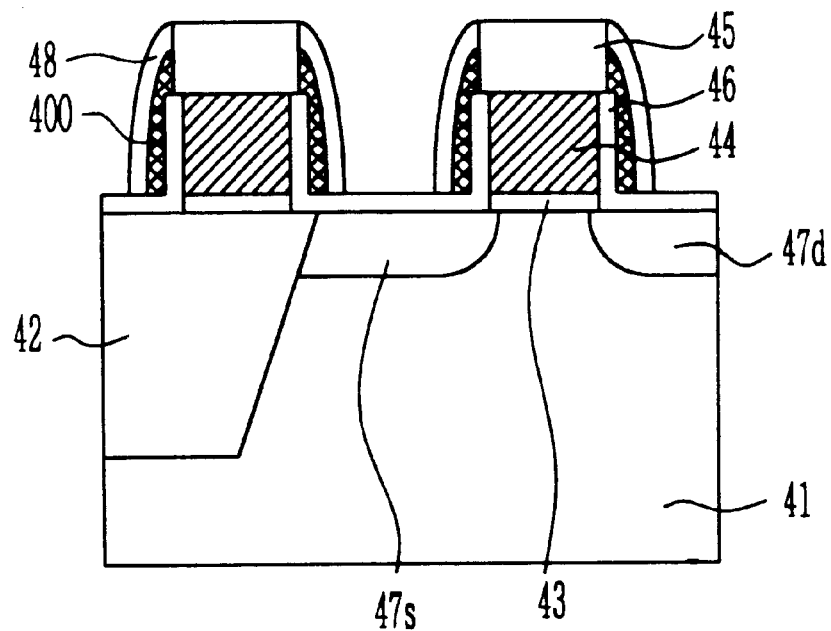

Referring to FIG. 2C, an insulating film spacer 48 connected to the hard mask layer 45 is formed on the auxiliary electrode 400.

In the above, it is preferred that the insulating film spacer 48 is formed of a nitride-serial material. The gate electrode 44 and the auxiliary electrode 400 are surrounded by the hard mask layer 45 and the insulating film spacer 48 and are isolated from the outside.

Figure 2D:
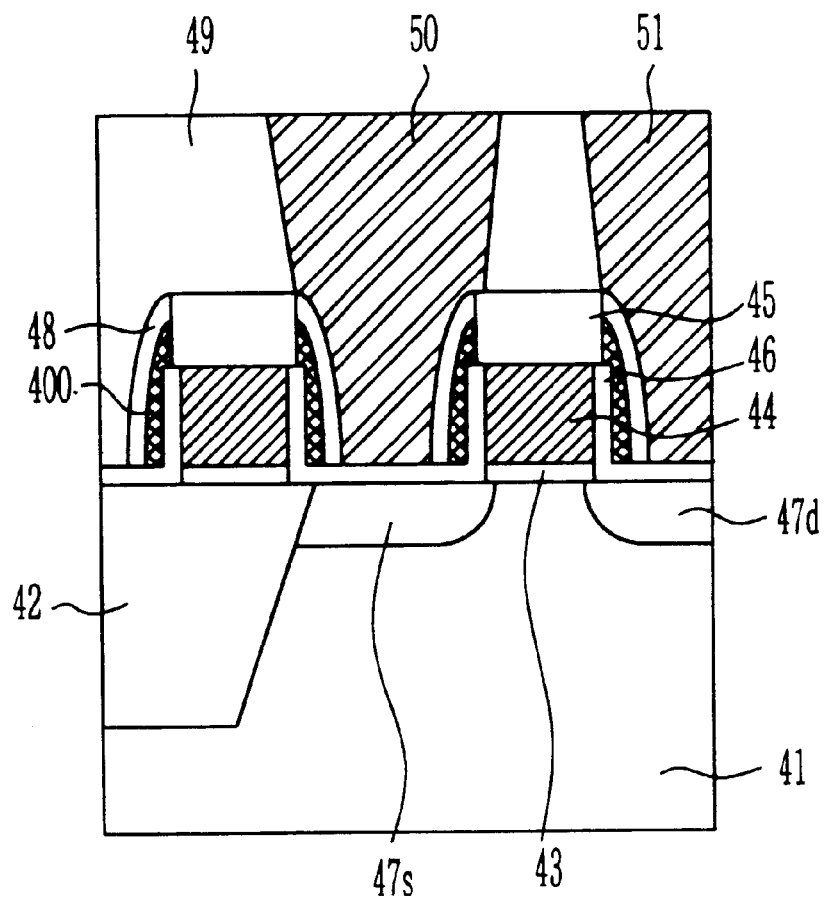

Referring now to FIG. 2D, an inter-dielectric layer 49 is formed on the entire surface including the auxiliary electrode 400. Then, a self-aligned contact mask process and an etch process of the inter-dielectric layer 49 are performed to form contact holes through which the source 47s and the drain 47d are exposed, respectively. Next, a storage node contact 50 connected to the source 47s and a bit line contact 51 connected to the drain 47d are formed.

In the above, polysilicon is deposited and an etch-back process or a chemical mechanical polishing (CMP) process is performed to form the storage node contact 50 and the bit line contact 51.

Thereafter, general processes such as processes of forming bit lines, capacitors and metal wires are performed to complete a semiconductor device. Meanwhile, though there are not shown in FIG. 2A~FIG. 2D, it should be noted that a first metal wire for connecting a first power supply source to the gate electrode 44 and a second metal wire for connecting a second power supply source to the auxiliary electrode 400 may be formed upon formation of the metal wire.

Figure 3:
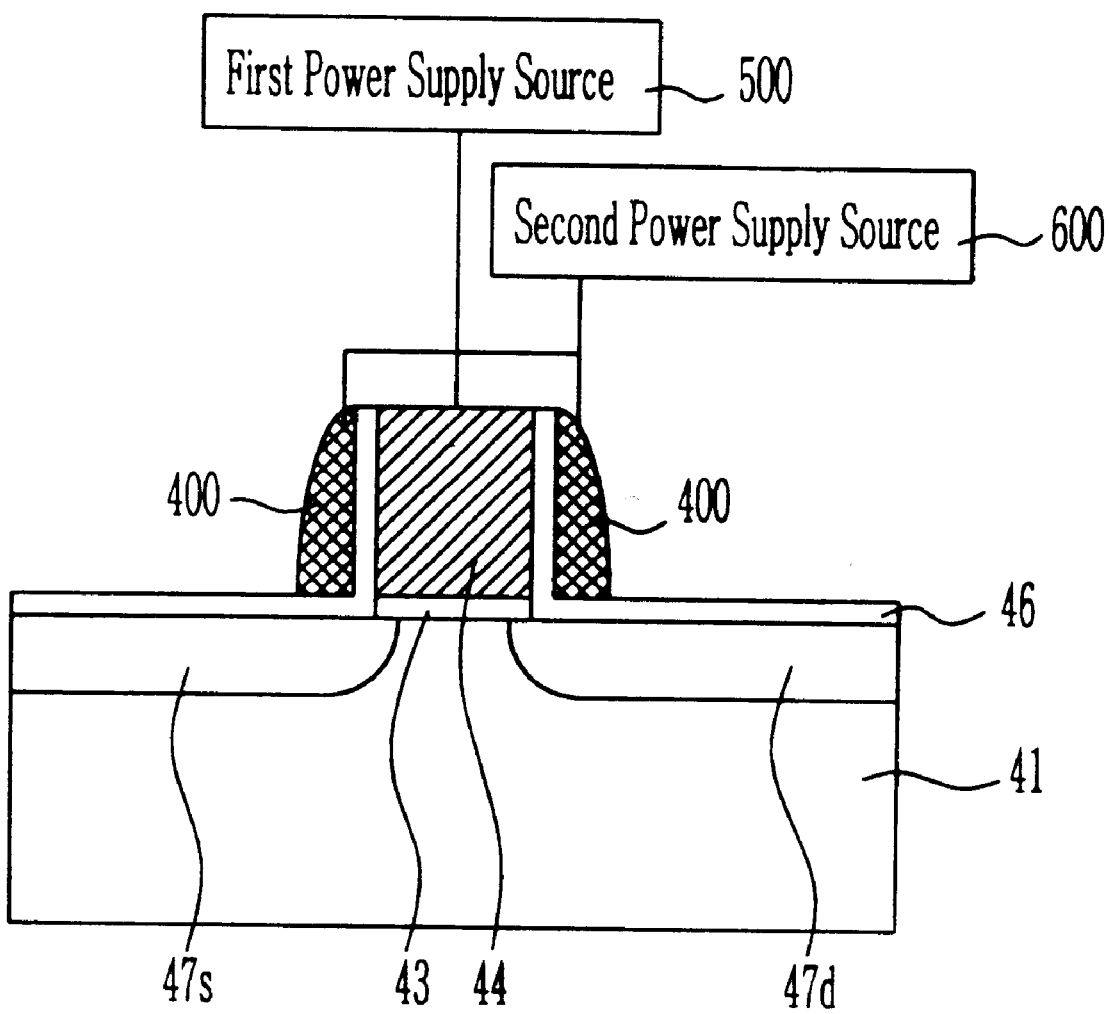
FIG. 3 is a cross-sectional view of a semiconductor device for describing a transistor structure of the present invention.

FIG. 3 is a cross-sectional view of a semiconductor device for describing a transistor structure of the present invention manufacturing by the process steps in FIG. 2A~FIG. 2D, and its operation.

Referring now to FIG. 3, the transistor of the present invention includes the gate electrode 44 electrically isolated from the semiconductor substrate 41 by the gate oxide film 43 and connected to the first power supply source 500, the source 47s formed in the semiconductor substrate 41 at one side of the gate electrode 44, the drain 47d formed in the semiconductor substrate 41 at the other side of the gate electrode 44 and oppositely formed to the source 47s, and the auxiliary electrode 400 formed at both sides of the gate electrode 44, electrically isolated from each of the gate electrode 44, the source 47s and the drain 47d by means of the oxide film 46 and connected to the second power supply 600.

In the transistor of the present invention having this construction, generation of a coupling noise can be prevented as well as a refresh operating characteristic can be improved as a voltage is applied to the auxiliary electrode 400.

In a transistor that is turned on/off depending on a voltage applied to the gate electrode 44, a region where the gate electrode 44 and the source/drain 47s and 47d overlap is maintained to have the same voltage by the auxiliary electrode 400 by always applying a high voltage to the auxiliary electrode 400 upon an on operation of the transistor even when the gate electrode 44 becomes a zero (0) volt upon a refresh operation of a DRAM device. Therefore, generation of GIDL current can be prevented to improve a refresh-operating characteristic. Further, as the auxiliary electrode 400 always maintains the same voltage between the gate electrode 44 and the bit line, a coupling noise due to a shielding effect can be prevented even though the gate electrode is continuously turned on/off.

In the DRAM device, in case of using a negative word line scheme, there was a problem that a GIDL current is increased to degrade the refresh characteristic as a high electric field is applied between the word line 44 and the storage node compared to a case of using the word line 44 having a normal zero volt since the word line 44 maintains a negative voltage in a standby state or a refresh stage. In the transistor of the present invention, the GIDL current can be reduced by applying a zero (0) volt to the auxiliary electrode 400 when the transistor is turned off by applying a negative voltage to the gate electrode 44, and by applying a pumping voltage (Vpp) to the auxiliary electrode 400 when the transistor is turned on by applying a pumping voltage (Vpp) of a high voltage to the gate electrode 44.

As mentioned above, the present invention manufactures a transistor in which an auxiliary electrode, to which a voltage is applied apart from a gate electrode, is formed at both sides of the gate electrode. Therefore, the present invention can improve a refresh operation characteristic of a device by preventing a GIDL current due to a high electric field between a word line and a storage node and can improve an operating reliability of the device by preventing generation of a coupling noise due to a shielding effect by a constant voltage between the gate electrode and the bit line.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A transistor in a semiconductor device, comprising:
   a semiconductor substrate;
   a gate oxide film formed on said semiconductor substrate;
   a gate electrode electrically isolated from said semiconductor substrate by said gate oxide film and connected to a first power supply source;
   a hard mask layer formed on said gate electrode;
   a source formed in the semiconductor substrate at a first side of said gate electrode;
   a drain formed in the semiconductor substrate at a second side of said gate electrode and formed oppositely to said source;
   an oxide film formed at the sidewall of the gate electrode and the surface of the semiconductor substrate;
   an auxiliary electrode formed at the first and second sides of said gate electrode, electrically isolated from said gate electrode, said source and said drain by means of said oxide film and connected to a second power supply source, wherein the upper side of the auxiliary electrode is located below an upper side of the hard mask layer; and
   an insulating film spacer formed at the sidewall of a portion of the hard mask layer and the outer surface of the auxiliary electrode.

2. The transistor as claimed in claim 1, wherein when said transistor is on, a voltage equal to a voltage applied to said gate electrode is applied to said auxiliary electrode.

3. The transistor as claimed in claim 1, wherein when said transistor is off, a voltage equal to a voltage applied to said gate electrode is applied to said auxiliary electrode.

* * * * *